Figure 1:
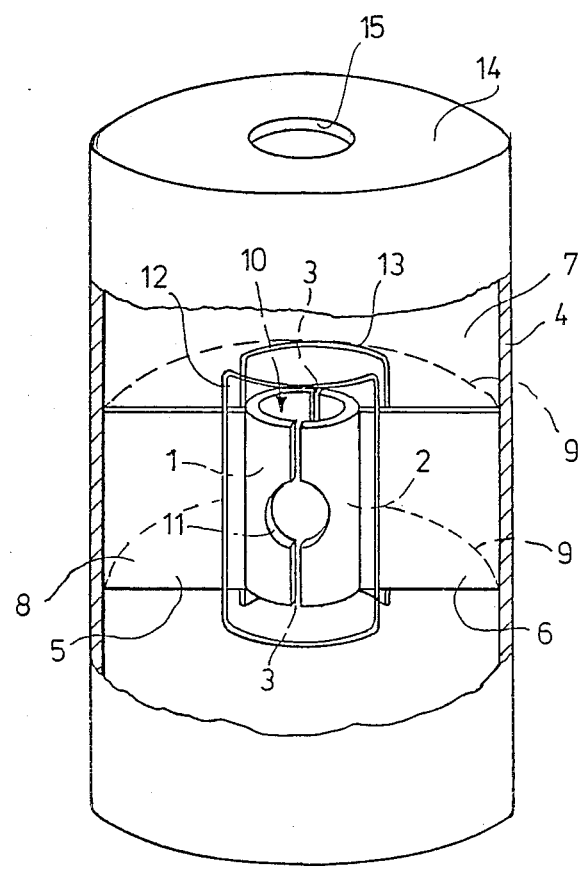

United States Patent [19]

Brunner et al.

[11] Patent Number: 4,791,392
[45] Date of Patent: Dec. 13, 1988

[54] RESONANCE SYSTEM

[75] Inventors: Hermann Brunner, Schriesheim; Karl H. Hausser; Werner Veith, both of Heidelberg, all of Fed. Rep. of Germany

[73] Assignee: Max-Planck-Gesellschaft zur Forderung der Wissenschaften e.V., Gottingen, Fed. Rep. of Germany

[21] Appl. No.: 871,087

[22] Filed: Jun. 5, 1986

[30] Foreign Application Priority Data

Jun. 7, 1985 [DE] Fed. Rep. of Germany ....... 3520410

[51] Int. Cl.$^4$ .................. H01P 7/06; G01R 33/20
[52] U.S. Cl. .................... 333/219; 324/316; 324/318
[58] Field of Search .............. 333/202, 204, 205, 208, 333/219, 222–235, 245, 248; 324/300, 307–322, 58 R, 58 A, 58 C, 58.5 R, 58.5 B, 58.5 C

[56] References Cited

U.S. PATENT DOCUMENTS 2,682,622  6/1954  Nergaard ................ 333/231 X
4,453,147  6/1984  Froncisz et al. ............ 333/219

OTHER PUBLICATIONS

Momo et al., J. Phys. E: Sci. Instrum., vol. 16 (1983) pp. 43–46.
Froncisz et al., J. of Magn. Resonance, vol. 47 (1982) pp. 515–521.

Primary Examiner—Marvin L. Nussbaum
Attorney, Agent, or Firm—Harness, Dickey & Pierce

[57] ABSTRACT

A resonance system for ESR spectroscopy has a resonance cavity (23) which is connected by axial slots (25) with chambers (24) coaxial to the resonance cavity (23). The resonance cavity (23) and the chambers (24) are located within a metallic screen (21). The wall sections (26) of the resonance cavity (23), separated by the axial slots (25), form the inductances of the resonance circuit, whereas the wall sections of the axial slots (25), located opposite one another, form the capacitances. The entire resonance system, including the screen, is made of metal and is, therefore, suitable for use at extremely low temperatures.

15 Claims, 4 Drawing Sheets

RESONANCE SYSTEM

The invention relates to a resonance system, particularly for ESR spectroscopy, comprising a resonant circuit which has at least 2 metallic wall sections defining the periphery of a resonance cavity and separated by axial slots, which wall sections essentially determine the inductance of the resonant circuit, whereas the faces of the wall sections limiting the axial slots essentially determine the capacitance of the resonance circuit, and comprising further a metallic screen surrounding the wall sections.

A resonance system of this type is known, for example, from Pages 43–46 of J. Phys. E: Sci. Instrum., Vol. 16 (1983). This entry also deals with the theory of the operation of the resonant circuit of such a resonance system. The design of a resonance system of this type, applied in practice, is described in detail in U.S. Pat. No. 4,453,147. In the case of these known resonance systems, the circular wall of the resonant circuit is only interrupted by a single axial slot. However, Pages 515–521 of J. Magn. Reson., Vol. 47 (1982) also refer to a resonance system where the walling of the resonant circuit is subdivided into several wall sections by several axial slots.

The decisive factor in using a resonance system of this type in ESR spectroscopy consists in generating, inside the resonance cavity, an HF magnetic field of high field strength within the narrowest possible space. Furthermore, it must be possible to introduce the resonance system into the field of a strong static magnet. When using iron magnets only limited space is available between the pole shoes determining the homogeneous field. In addition, measurements frequently have to be carried out at low temperatures (low helium). For this purpose the sample has to be located within the magnet in a cryostat. It is precisely in such cases that the use of the known resonance systems causes considerable difficulties because the mounting of the wall sections of the resonant circuit within the screen by means of support elements which are electrically non-conducting and preferably low loss as well, requires a design which incorporates different materials which usually also have different thermal expansion coefficients, with the result that when the known resonance systems are cooled to extremely low temperatures this can cause interference to the supply or even destruction of the material and also lead to significant distortion of the resonance of the resonant circuit. In addition, because of the necessity of using materials which are stable even at extremely low temperatures the choice of materials is reduced significantly.

Now, it is the object of the present invention to improve a resonance system of the type mentioned above so that it can be used without difficulty at extremely low temperatures without this involving any compromise in respect of the required electrical properties.

This problem is solved according to the invention by the fact the wall sections are connected to the screen by a metallic structure which forms chambers having axes which are parallel to the axis of the resonance cavity, each of said chambers being connected to the resonance cavity by axial slots having a circumference in the plane vertical to its axis which is significantly larger than the extent of the wall sections between each pair of neighboring axial slots.

The invention makes it possible, therefore, to design the entire resonance system uniformly from the same metal with the result that the risk of thermal stress is avoided totally. By choosing a metal with a low coefficient of expansion, it can also be ensured that no significant shift of the resonance frequency occurs when cooled to extremely low temperatures. In addition, the resonance system designed according to the invention provides the facility for correction of minor frequency shifts.

Just as in the case of the known resonant circuit using metallic wall sections defining the periphery of a resonance cavity and separated from one another by axial slots, in the case of the resonance system according to the invention, too, the resonance frequency is determined by the series connection of inductances formed by the metallic wall sections and capacitances formed by the slots between the wall sections. However, in the case of the resonance system according to the invention, the inductances are also connected parallel to the capacitances, which are formed by the wall sections defining the individual chambers. The requirement that the circumference of the chambers has to be significantly greater than the extent of the wall sections is based on the fact that the inductances formed by the walling of the chambers have to be great enough for their resistance to be sufficiently high at the operating frequency of the resonance system so as not to cause significant disturbance. In any case, the capacitive resistance of the axial slots should not be significantly affected by the inductive resistances of the chambers and, in particular, no disruptive secondary resonances should occur. This is definitely the case if the inductances of the chamber walling are very considerable compared with the inductances of the wall sections of the resonance cavity which are separated by the axial slots, and this in turn is definitely the case when the circumference of the chambers is significantly larger than the extent of the wall sections between every two axial slots neighboring each other.

On the other hand, the size of the chamber does, of course, exert a certain influence on the resonance frequency of the entire resonance system with the result that, here too, it is possible, by altering the relationships in one or several of these chambers, to affect the resonance frequency and thereby to cause the entire resonance system to resonate without having to interfere with the actual resonance cavity, so that this remains totally undisturbed and wholly available as a sample area.

In a particularly simple embodiment of the invention the wall sections are connected to the screen by radial bars, each being arranged more or less symmetrically between two adjacent axial slots. In this case the chambers surrounding the resonance cavity are formed by the sections of the annulus separated by the radial bars, with this annulus being located between the resonance cavity and the screen.

A design which is particularly suitable for the manufacture and fitting of such a resonance system is one where the resonance cavity, the chambers and the axial slots connecting the resonance cavity with the chambers are formed by recesses in a metallic body inserted in the screen. With a resonance system of this type the metallic body can easily be constructed separately and provided with the required recesses, and it is easy to insert such a body into a tube serving as a screen. In this way it is possible for the recesses forming the resonance cavity and chambers to consist simply of cylindrical bores which are then connected to each other by sawn or milled slots. In this case it is also easy to have a plurality of chambers distributed over the periphery of the resonance cavity. The use of several chambers distributed along the periphery of the resonance cavity offers the advantage that the irregularities of the magnetic field in the resonance cavity, caused by electrical fields concentrated on the axial slots, are largely counterbalanced and remain restricted to a narrow marginal zone. Furthermore, systems of this sort can be manufactured in a way that the axial slots between the resonance cavity and the chambers have a considerable extension in a radial direction significantly increasing the capacitances compared with known resonance systems. This means that the electrical field is restricted more or less to the inside of the axial slots.

According to a further improvement of the arrangement of the invention the internal diameter of the screen is so small that no cavity resonances near the operating frequency of the resonance circuit, which would render location of the circuit resonance difficult, can be activated within the screen. Incidental resonances of this type occur with screens with larger internal diameters, particularly if additional NMR coils are inserted in the screen cylinder. This also prevents activation of waveguide modes within the screen at operating frequency of the resonance circuit, which might possibly be reflected and which could cause considerable interference or, at least, would represent a considerable energy loss and would result in significant attenuation of the resonance circuit.

According to a further improvement of the arrangement of the invention at least two wall sections of the resonance cavity located opposite one another are reduced, by openings extending in a circumferential direction to the axial slots, to two parallel circuit sections located at the ends of the resonance cavity, whose spacing is roughly the same as the radius of the resonance cavity.

The openings located in the wall sections provide access to the inside of the resonance cavity without affecting in any way the axial accessibility of the resonance cavity for purposes of inserting a sample. In particular, such an opening allows light to enter and, if applicable, other rays, in order to observe or influence the sample. At the same time, this measure serves to homogenize the magnetic field in the resonance cavity because, if the circuit sections formed by the peripheral areas of the walling are spaced so that the distance is roughly that of the radius of the resonance cavity, these circuit sections correspond to the winding sections of a Helmholtz coil, which produces an almost completely homogeneous magnetic field.

Frequently it is necessary to combine ESR and NMR experiments, in which case the sample contained in the resonance cavity has to be activated with a frequency of between 10 and 100 MHz. Given the dimensions which are used in the resonance system according to this invention a special HF coil must be used for this purpose. With the resonance system in accordance with the invention an HF coil of this type can have winding sections being located on the outside of the wall section and either surrounding one of each pair of axial slots positioned opposite one another, or arranged adjacent to one of two openings located in opposite wall sections. As an alternative to this it is also possible to provide the resonance system with an HF coil which has winding sections located parallel to the open ends of the resonance cavity. In this case the magnetic field of the HF coil would not be vertical to the magnetic field in the resonance cavity but arranged parallel to it. In any case the dimensions and spacings of the winding sections are selected so that they again form a Helmholtz coil, in order that the magnetic field produced in the area between the winding sections be as homogeneous as is possible.

Instead of or in addition to the openings located in the wall sections, each of the axial slots can be enlarged in their central area to form an opening. Such an opening can, for example, also serve as a light entry aperture or can enlarge the area for inserting the HF magnetic field, if the winding of an HF coil is adjacent to the extended axial slots.

As is known with the resonance systems of the type being dealt with here, coupling and uncoupling of energy can be by means of coupling loops which are arranged parallel to an end face of the resonance circuit. In the case of the known resonance systems they were arranged essentially concentric to the resonance cavity, so that, on the one hand there was the danger of an impediment to insertion of the sample and, on the other hand, the opportunity to change the coupling was limited. However, in the case of the preferred embodiment of the resonance system according to the invention, the coupling loop is located parallel to one end of one of the chambers, where it causes no interference and where the coupling factor can also be changed easily by varying the distance to the chamber.

The simplest method is to fix the coupling loop on the end of a coaxial transmission line inserted coaxially in the screening. If space is limited it is also possible to allow the coupling loop to extend radially through an opening in the screen into the area enclosed by the screen.

Just as the chambers connected to the resonance cavity provide a simple way to connect the resonance system, they also permit, within certain limits, a change in the resonance frequency of the resonance system by influencing the field overflowing into the chamber or from the chamber to the resonance cavity. Therefore, a further embodiment of the invention provides for a dielectrical or metallic tuning element extending into at least one of the chambers. Here too, it is a particular advantage of the invention that the operations required to detune in the area of such a chamber have no reactive effects on the formation of the magnetic field in the resonance cavity and that, furthermore, access to the resonance cavity is not impeded.

In the case of very sensitive electron spin resonance measurements, in particular when measuring short relaxation times with ESR pulse spectrometers, bimodal microwave resonant circuits are often used which, in a given area, produce orthogonal magnetic fields of an identical frequency. Systems of this type are described, for example, in German Pat. No. 16 98 223 and German patent application No. 29 17 794. Here again, it is the case that these known systems, because they are constructed using different materials or because of their particular configuration, are not suitable for use in conjunction with cryostats. The resonance system according to the invention also allows a bimodal microwave resonant circuit to be produced, which has all the advantages which have been put forward above for the resonance system according to the invention. In this case the bimodal resonance system, in accordance with the invention makes use of metallic bodies which contain the resonance cavity, the chambers and the axial slots, at least two wall sections of the resonance cavity facing one another being provided with openings. According to a further embodiment of the invention, two such metallic bodies are combined with one another so that the resonance cavity of the one metallic body is penetrated by one body containing the resonance cavity, the chambers and the connecting axial slots of a second resonance circuit in such a way that the axes of the resonance cavities extend substantially vertically relative to each other and the ends of the resonance cavity of the second internal resonance circuit are positioned opposite to openings in the wall sections of the first external resonance circuit.

With this configuration, the walls of the two resonance cavities have sufficiently large openings provided in such an arrangement that there is no significant interference to the individual systems and the magnetic field of the external resonance circuit prevails in the resonance cavity of the inner resonance circuit in addition to the magnetic field belonging to that second resonance circuit. In addition, the design according to the invention of the individual resonance circuits enables the available openings to be coincident with one another so that the introduction of a sample can be effected without difficulty and so that light is allowed to penetrate. In addition, it is possible to have external coils here to produce an NMR field. At the same time the result is here again a mechanically and thermally—and thus also electrically—very stable, all-metal design, which meets all requirements to the optimum. Nevertheless, facilities for adjustment may be provided which permit a very accurate adjustment of the orthogonality of the magnetic fields. It is possible, for example, for the body containing the internal resonance circuit to be pivoted at its ends in the walling of the screen around an axis substantially coincident with the axis of the resonance cavity of the external resonance circuit.

Additional details and modifications of the invention will appear from the description of the embodiments represented in the drawing. The features contained in the description and the drawing can be used in other embodiments of the invention, either individually or severally, in any combination. In the drawing FIGS. 1 and 2 show each a diagrammatic, perspective representation of a resonance system according to the invention.

Figure 3:
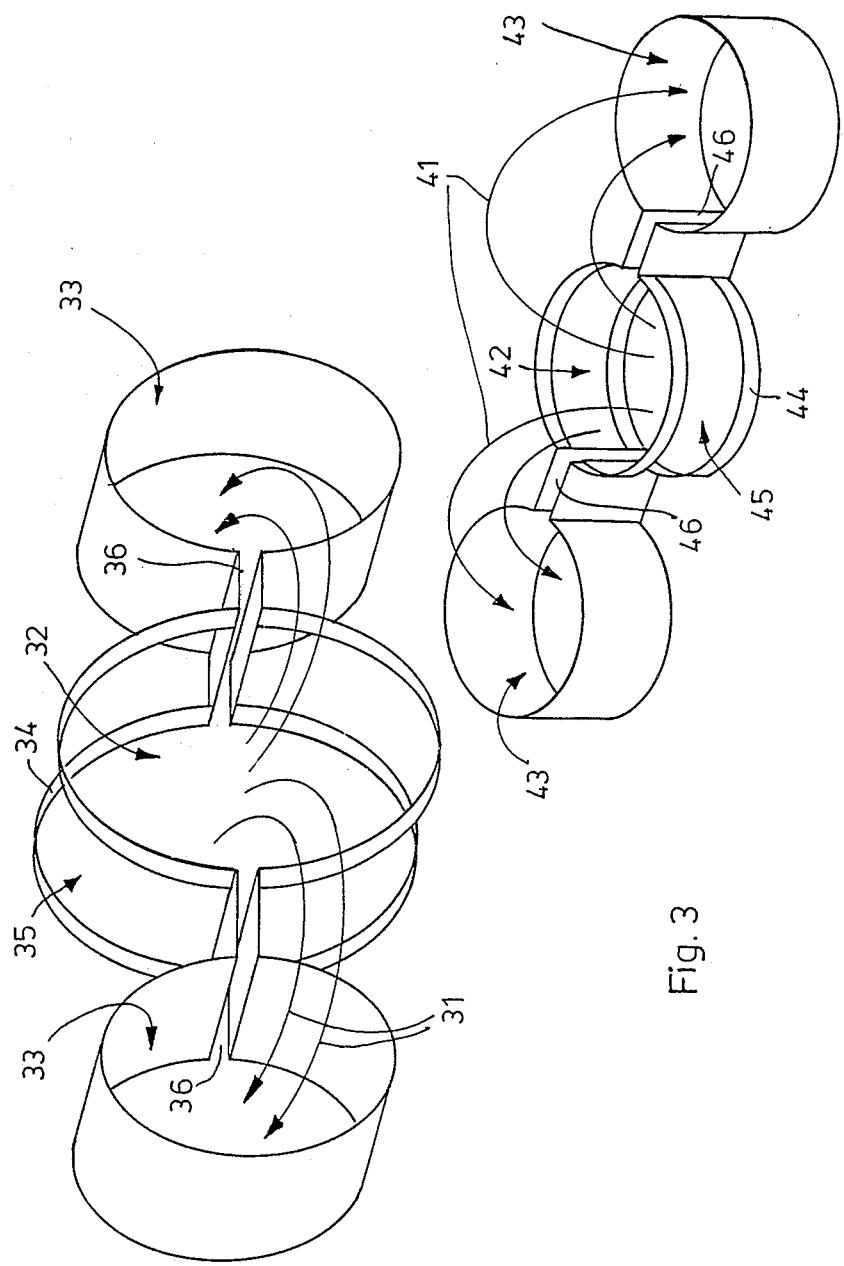
Figure 4:
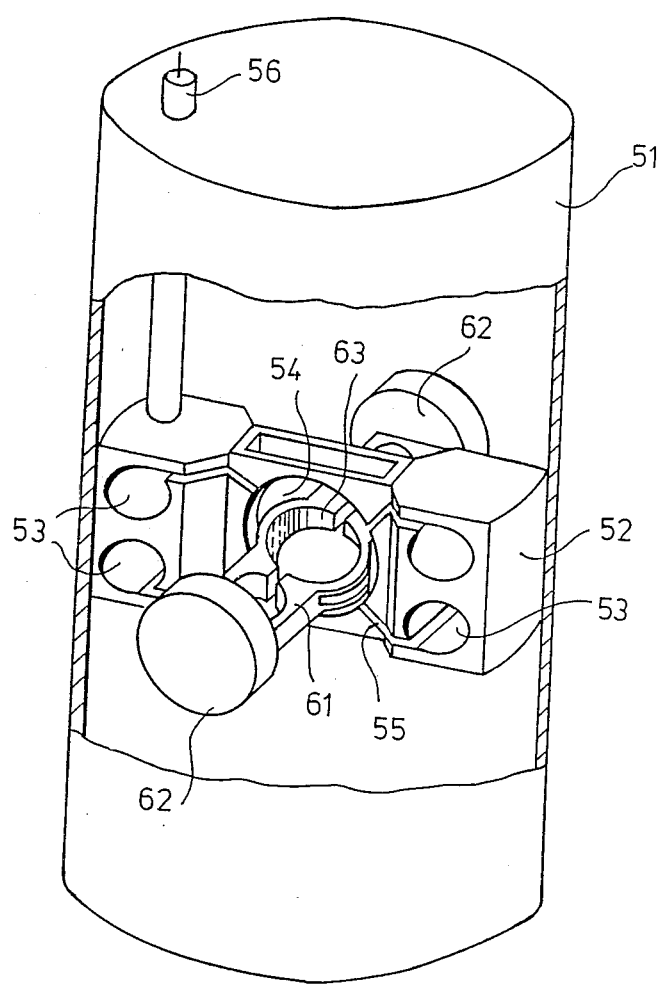

FIG. 3 shows the diagrammatic representation of two resonance circuits, which are particularly suitable for the construction of a bimodal resonator, and, FIG. 4 shows a diagrammatic, perspective representation of a bimodal resonator according to the invention.

Figure 2:
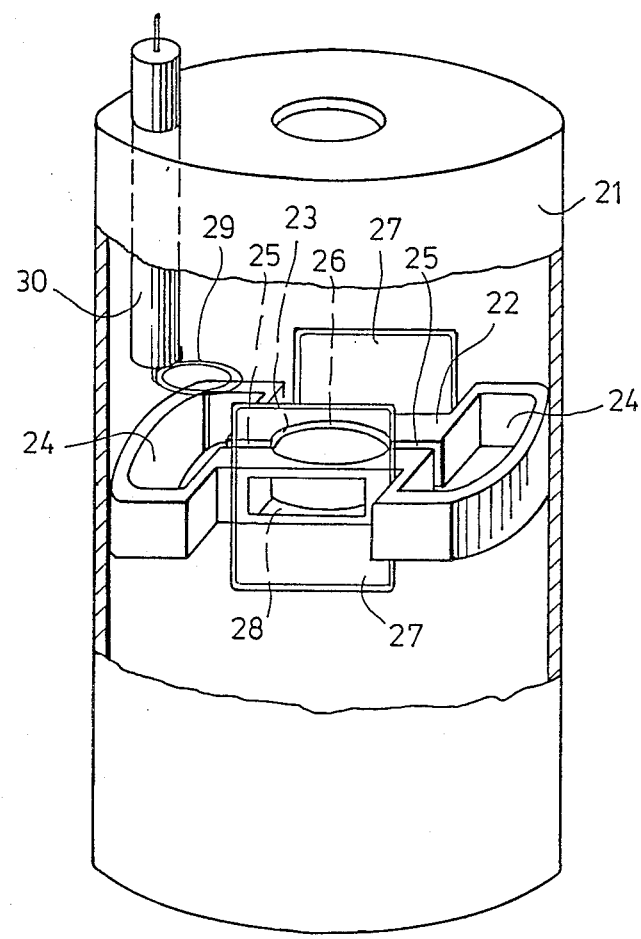

The resonance system represented in FIG. 1 has two wall sections (1), (2) which form together a tubing section and which are separated from each other by two axial slots (3) located diametrically opposite one another. The wall sections (1), (2) are located within a tube-shaped metallic screen (4) and are retained by means of radial bars (5), (6) which connect the screen (4) with a point on the wall sections (1), (2) which is located symmetrically between the two axial slots (3). The radial bars (5), (6) are the same height as the wall sections (1), (2). As a result, this forms on the outside of the wall sections (1), (2) the chambers (7), (8) which have their ends open in the axial direction of the screen (4), which are separated by the bars (5), (6) and which are limited externally by the sections of the screen (4) marked by the broken line (9).

The wall sections (1), (2) form a resonance circuit, whose resonance frequency is determined by thne inductances formed by the wall sections (1), (2) and the capacitances formed by the surfaces of the axial slots (3), each of which is connected in series and which are located opposite one another. This resonance frequency is, however, also determined by the dimensions of the external chambers (7), (8). The dimensions of the resonance system are, however, selected so that the resonance frequency of the resonance circuit is smaller than the cut off frequency of the waveguide section formed by the screen (4), with the result that no waveguide modes, whose frequency is the same as the resonance frequency of the resonance circuit, are possible within the screen. Consequently, no oscillation modes can exist within the chamber (7) with the result that, as is the case with the resonance cavity (10) enclosed by the welling sections (1), (2), the walling limiting the chambers and including the relevant sections of the wall sections (1), (2) the surfaces of the bars (5), (6) and the sections of the screen (4) limited by the lines (9), form an inductance. As the size of the chamber in a plane perpendicular to the axis of the resonance cavity (10), in comparison with the measured length of the wall sections in the same plane, is much greater the inductance formed by the chamber walling also is comparatively large with the result that the resonance frequency of the resonance circuit is not notably influenced by it. Basically, this inductance forms a resistance, parallel to the capacitance of the axial slot (3), whose influence decreases the larger it becomes in proportion to that formed by the axial slot (3). As a result, the metallic radial bars (5), (6), which connect the wall sections (1), (2) with the screen (4), do not cause any interference.

The advantage of this design is that the resonance system represents a uniform structure made from the same material, which displays both a high mechanical and thermal stability and is, therefore, also ideal for use at extremely low temperatures. The formation of the resonance circuit guarantees the formation of an HF magnetic field with good homogeneous properties within the resonance cavity, into which the high electrical fields of the capacitances penetrate in the area of the axial slots (3) only minimally. The homogeneity of the magnetic field can, if necessary, be improved even further by extending the middle of the axial slots, as demonstrated in the illustrated embodiment by the circular openings (11).

The opening (11) extending the axial slots (3), is not only suitable for improving the homogeneity of the magnetic field but also permits access to the interior of the resonance cavity (10), for example for the purposes of lighting or irradiating the sample. In addition, they offer room for the insertion of an HF magnetic field, which is required for NMR experiments and is produced by a coil located outside the resonance cavity (10). In the embodiment represented in FIG. 1, the HF coil encloses two winding sections (12), (13) which are located on the outside of the wall sections (1), (2) in such a way that each winding section surrounds one of the axial slots (3) or so that the circular openings (11) lie on the same axis as the two winding sections. The dimensions of the winding sections (12), (13) are selected so that essentially they form a Helmholtz coil, which produces a substantially homogeneous axial magnetic field which, because of the design of the coil, penetrates the openings (11).

In the diagrammatic representation shown in FIG. 1, the electrical connections for the winding sections and their connection are omitted for the sake of simplicity. Similarly the devices for coupling and uncoupling the energy to or from the resonance circuit are not shown. Standard coupling elements, in particular coupling loops, can be used for this purpose. A test substance can be introduced into the resonance cavity (10) through its open ends in a direction axial to the resonance cavity. For this purpose the embodiment has a concentric opening (15) on the front wall (14) of the screen (4). In addition, it is also possible to insert in the screen (4), either radially or axially, elements influencing the fields in the chambers (7), (8), for example dielectrical bodies located adjacent to the axial slots or also metallic bodies, whereby the resonance frequency of the resonance circuit can be varied within certain limits.

FIG. 2 represents an embodiment of the resonance system according to the invention in which the body (22) is inserted in the screen (21) and the body is provided with a central bore forming the resonance cavity (23), and with two peripheral recesses which form chambers (24) coaxial to the resonance cavity (23) and connected to the resonance cavity (23) by axial slots (25). Here again, it is ensured that the size of the chambers (24), which extend over a considerable angular sector of the cross-section of the screen (21), is considerably larger than the dimensions of the wall sections (26) located between the axial slots (25) lying opposite one another.

This embodiment of the invention also comprises an HF coil for NMR experiments, which has two winding sections (27). However, these winding sections do not surround the axial slots but each is adjacent to an opening (28) located in the corresponding wall section (26) and extending each to the adjacent axial slots (25). As a result of these openings (28), the wall sections (26) are reduced to narrow circuit sections which give the wall sections the character of a winding. The dimensions of the metallic body and its recesses are selected so that the distance between the circuit sections, on which the wall sections (26) are reduced, is roughly equal to the radius of the resonance cavity. Here again, this creates conditions which correspond to those of a Helmholtz coil, whereby it is ensured that, in spite of the openings (28) in the wall sections (26), the magnetic field within the resonance cavity (23) is homogenous. The openings (28) guarantee good entry by the magnetic field produced by the winding sections (27) of the HF coil, the magnetic field, in this design as well, being vertical to the microwave magnetic field prevailing in the resonance cavity (23).

Again, details on the conductive connection of the winding sections and their electrical connection to an HF generator have been omitted in this representation. A coupling loop (29) is represented diagrammatically and is located at the end of a coaxial transmission line (30). This coaxial line is inserted into the screen (21), parallel to its axis, and its end is opposite one of the chambers (24). The coupling loop (29) is located so that its surface runs parallel to the end plane of the chamber (24). As a result, the lines of force emerging from the chamber (24) and entering the resonance cavity (26) must penetrate the loop (29). The coupling coefficient can easily be altered by ensuring that the coupling loop of the chamber is reinforced to a greater or lesser degree.

A particular advantage of this embodiment of the invention is not only that the metallic body with its recesses can easily be manufactured separately and then mounted within the screen but also the fact that the axial slots (25) separating the wall sections of the resonance cavity from one another are considerably larger in a radial direction so that large surfaces arise which, correspondingly, form large capacitances and the concentration of the electrical field on the area of the axial slots (25) is improved. As the electrical field causes interference is ESR experiments, this embodiment of the invention provides a particularly large area within the resonance cavity in which, for all practical purposes, only one magnetic field prevails which is, at the same time, concentrated on the narrow resonance cavity and therefore has the required high field strength.

Although the resonance cavity and the chambers connected by axial slots are open at their ends, only the internal surfaces of the areas are, for all intents and purposes, effective for the electrical function. It is, therefore, possible without difficulty to reduce the wall thickness of the metallic bodies which have recesses to the level which is permissible for mechanical stability. The metallic bodies could, therefore, also take the form represented in FIG. 3 and, for example, be made from sheet steel. As far as the operation of these resonance circuits in concerned, it is important that the magnetic field, whose course is represented in FIG. 3 by broken lines (31), (41) is substantially restricted to the inside of the resonance cavity (32), (42) and the chambers (33), (43), and the currents flowing on the insides of the chambers are linked to the regression field. The field lines in each case are only complete in the areas adjacent to the end faces of the resonance circuit. As the resonance frequency of the circuit is dependant on the product resulting from inductance and capacitance, it is possible to produce resonance circuits with identical resonance frequency, but differing dimensions, by means of a change in the opposite direction of inductance and capacitance. In this connection, as represented above, the size of the chambers still exerts a certain influence. To determine the level of this influence for practical purposes, experiments were carried out in which a resonance cavity with a diameter of 6 mm and circular chambers similar to the design according to FIG. 2 were used. In each case, the size of both the circular chambers and the kidney-shaped chambers is given. The following frequencies were measured:

| Chamber diameter or shape | 5 mm | 6 mm | 7 mm | kidney-shaped | |
| --- | --- | --- | --- | --- | --- |
| Chamber size | 14.6 mm | 17.8 mm | 21 mm | 29 mm | 45 mm |
| Frequency | 9.03 GHz | 8.4 GHz | 7.825 GHz | 7.52 GHz | 7.2 GHz |

As has already been mentioned above, the inductance formed by the chamber is connected in parallel to the capacitance with the result that the reduction in the capacitance resistance increases as the inductive resistance decreases. As a result, a chamber with a small diameter and a correspondingly low inductive resistance produces considerably higher frequencies. If the diameter is increased the capacitance increases similarly, causing a drop in frequency if the inductance of the resonance cavity remains the same. On the contrary, the proportion of energy of the magnetic field concentrated on the resonance cavity increases as the external chambers increase in size and, subsequently, contribute less to the total inductance of the resonance circuit. With a resonance circuit with two chambers designed in the "dumbbell" shape referred to above and with a resonance cavity of 6 mm diameter, 58% of the HF energy is located in the resonance cavity if the diameter of the chambers is 5 mm. If the chamber size is increased to a diameter of 6 mm the energy proportion increases to 66.7%, with a chamber diameter of 7 mm it increases to 73%, and with a 9 mm chamber diameter it increases to as much as 82%. As the chamber diameter cannot be increased at desire, because of the space that this would require and because of the need to keep the diameter of the screen small in view of the limiting frequency of the waveguide formed by the screen, it is frequently expedient to switch from using circular chamber cross-sections to the use of sector-shaped or kidney-shaped designs.

A further method of reducing the influence of the chambers is to locate more than two chambers on the circumference of the resonance cavity and connect these to the resonance cavity by axial slots. However, even with resonance circuits which have four or even eight axial slots it is expedient to use chambers which are not circular in shape.

Multi-slot designs have three basic advantages, i.e, in addition to the high level of efficiency already mentioned, they provide a homogenized $H_1$-field in an azimuthal direction and also a reduced electrical HF field in the central area. It can be seen without difficulty that the field within the resonance cavity does not have complete circular symmetry but, because of the concentration of the electrical field on the axial slots, it displays a certain periodicity. If a circuit has two axial slots a distinct double symmetry is still apparent. The greater the number of axial slots the less is the influence of the individual slots and there is, as a result, an increasing reduction in the periodicity of the field strength distribution. This phenomenon is also connected with the fact that an increase in the number of axial slots means that the capacitances formed by the walls of these axial slots have to be increasingly greater, with the result that there is an ever increasing concentration of the electrical field on these slots and the electrical field elements, determining the periodicity, penetrate less and less into the resonance cavity.

The two resonance circuits represented in FIG. 3 are designed so that the section forming the resonance cavity (42) of the lower resonance circuit fits into the resonance cavity (32) of the upper resonance circuit with the result, therefore, that the two resonance circuits can be combined to form a structure in which the axis of the resonance areas (32), (42) and thereby the magnetic fields prevailing in them extend perpendicularly relative to each other. This produces two orthogonal and, accordingly, uncoupled magnetic fields of the same frequency at the same point. Magnetic fields of this type are required, for example, for electron spin double resonance measurements and for particularly sensitive ESR measurements.

With the combination of two resonance circuits in accordance with FIG. 3 it is important that the walls (34), (44) of the resonance areas (32), (42) are again provided with very large openings (35), (45) through which the magnetic field produced by the other resonance circuit can pass. In addition, it is important for the design of a bimodal resonator that if the dumbbell-shaped structures are used, as already indicated above, the magnetic field is, in each case, restricted to the area of the planes defined by the axial slots (36), (46) and, as a result, no interference can occur in the area of the outer fields.

FIG. 4 shows an applied embodiment of such a bimodal resonance system. With this embodiment a first metal block (52) is inserted into the screen (51), which is similar to the metal block in the resonance system in accordance with FIG. 2; however, instead of the two kidney-shaped chambers it has four circular chambers (53), which are connected to the central resonance cavity (54) by axial slots (55) distributed at an angular spacing of 90° on the circumference of the resonance cavity (54). The chambers (53) are located asymmetrically vis-a-vis the axial slots (55), with the result that they are close to one another and the magnetic field penetrating these chambers, in this case as well, remains restricted to the neighborhood of one plane. The second resonance circuit is formed by a block (61), which is located diametrically in the screen (51) and whose dimensions are so selected that it fits through the resonance cavity (54) of the first resonance circuit. Located on the ends of the block (61) are plug-shaped extensions (62) by which the second resonance circuit is pivoted around its longitudinal axis in the walls of the screen (51). This pivot feature facilitates the precise adjustment of the orthogonality of the axes of the two resonance areas (54) and (63). The coupling to the external resonance circuit is by means of a coaxial transmission line (56), which again is located axially in the screen (51) and is provided at its end with a loop projecting into one of the chambers (53). Coupling to the second resonance circuit can be by means of a loop, as in the case of the design of FIG. 2. Here too, the adjustment mechanism already mentioned can be used to ensure that both resonance circuits are adjusted to precisely the same resonance frequency, which can be a particular requirement if both resonance circuits change their resonance frequency at a differing level when cooled to extremely low temperatures. However, it can be necessary for some purposes to reduce the efficiency of the circuits to a relatively low level by adopting attenuation measures, for example by coupling resistors using a further coupling loop and in this case minor differences in the resonance frequency are not important.

It goes without saying that the invention is not restricted to the embodiments represented in the drawing, but that variations of them are possible without departing from the scope of the invention. In particular, the resonance circuits can have any number of chambers, including an odd number, and these chambers can have any desired cross-sections. In addition, it could be appropriate, for example, to extend the axial slots towards these chambers so that at least one electrical field is present in one adjacent peripheral region of the chambers, permitting the capacitance of the resonance circuit to be influenced for tuning purposes. In addition to tuning measures, it is also imaginable to incorporate facilities to increase or decrease the attenuation of the circuits. Coupling and uncoupling of energy can be effected by the use of joint or separated coupling elements and, instead of loops, antennae can also be used as coupling elements in the manner used in microwave technology. In addition, the coupling elements need not be introduced axially into the screen but can project radially into the screened area through corresponding openings.

We claim:

1. Resonance system, in particular for use in ESR spectroscopy, comprising a loop-gap resonator including at least two metallic wall sections which define a cylindrical inner space having an axis and open ends each defining a plane which is perpendicular to said axis, each wall section having two end faces extending parallel to said axis, the end faces of adjacent wall sections facing each other and defining axial slots between said adjacent wall sections, said loop-gap resonator having an inductance defined by the dimensions of the wall sections and a capacitance defined by the dimensions of the axial slots separating adjacent wall sections, the system further comprising a metallic shield surrounding the loop-gap resonator, the improvement comprising metallic structures connecting each one of said wall sections to said metallic shield so that chambers are formed which are each limited by portions of said walls, of said metallic shield and of said metallic structures, and having an axis which is parallel to the axis of said cylindrical inner space, the perimeter of each of said chambers being significantly larger than the extent of the adjacent wall sections between their end faces in a plane which is perpendicular to said axis.

2. Resonance system in accordance with claim 1, wherein the wall sections (1, 2) are connected to the shield (4) by radial bars (5, 6) which in each case are arranged between said axial slots (3) essentially symmetrically.

3. Resonance system in accordance with claim 1, wherein the the axial slots connect the inner space with the chambers and further wherein the inner space (23), the chambers (24) and the axial slots (25) are formed by recesses in a metallic body (22) inserted into the shield (21).

4. Resonance system in accordance with claim 3, wherein a plurality of chambers (53) is distributed about the circumference of the inner space.

5. Resonance system in accordance with claim 3, wherein at least two of said wall sections (26) which are located opposite one another are reduced by openings (28) extending in each case in a circumferential direction to the axial slots (25), to two parallel line sections located at the ends of the inner space, said line sections having a spacing which is approximately the same as the radius of said inner space.

6. Resonance system in accordance with claims 3 or 6, comprising first and second loop-gap resonators, wherein the inner space (54) of the first loop-gap resonator is penetrated by a body (61) containing the inner space (63), the chambers and the connecting axial slots of said second loop-gap generator in such way that the axes of the inner spaces (54, 63) extend essentially perpendicularly relative to one another and the ends of the inner space (63) of the second loop-gap resonator are located opposite openings in the wall sections of the first loop-gap resonator.

7. Resonance system in accordance with claim 6, wherein the body (61) forming the second loop gap generator is pivoted at its ends (62) in the shield (51), around an axis which is essentially coincident with the axis of the inner space (54) of the first loop-gap resonator.

8. Resonance system in accordance with claim 1, wherein said shield is cylindrical and the internal diameter of the shield is so small that the cut off frequency of the waveguide section formed by the shield is higher than the operation frequency of the resonance system.

9. Resonance system in accordance with claim 1, wherein an HF coil is provided which has winding sections (12, 13) located on the outside of the wall sections (1, 2), each one of which surrounds one of said axial slots (3).

10. Resonance system in accordance with claim 1, wherein an HF coil is provided which has winding sections (27) located on the outside of the wall sections (26), each one of which being adjacent to one of two openings (28) oppositely located in wall sections.

11. Resonance system in accordance with claim 1, wherein an HF coil is provided which has winding sections located parallel to the open ends of the inner space.

12. Resonance system in accordance with claims 7, 8 or 9 wherein the winding sections (12, 13, 27) form a Helmholtz coil.

13. Resonance system in accordance with claim 1, wherein each of said axial slots (3) is extended in its central area to form an opening (11).

14. Resonance system in accordance with claim 1 with a coupling loop located parallel to one of the open ends of the resonance system, wherein the coupling loop (29) is arranged parallel to the open end of one of said chambers (24).

15. Resonance system in accordance with claim 1, wherein a coupling loop extends into at least one of the chambers.

* * * * *